(12) United States Patent
Bhattacharyya et al.

(10) Patent No.: US 9,957,618 B2
(45) Date of Patent: May 1, 2018

(54) SINGLE-UNIT REACTOR DESIGN FOR COMBINED OXIDATIVE, INITIATED, AND PLASMA-ENHANCED CHEMICAL VAPOR DEPOSITION

(75) Inventors: Dhiman Bhattacharyya, Arlington, MA (US); Karen K. Gleason, Lexington, MA (US); Miles C. Barr, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 624 days.

(21) Appl. No.: 13/407,075

(22) Filed: Feb. 28, 2012

(65) Prior Publication Data

US 2013/0224380 A1    Aug. 29, 2013

(51) Int. Cl.
  *C23C 16/00*    (2006.01)
  *C23C 16/509*   (2006.01)

(52) U.S. Cl.
  CPC ................ *C23C 16/509* (2013.01)

(58) Field of Classification Search
  CPC .................................................. C23C 16/509
  USPC ........................................................ 427/487
  See application file for complete search history.

(56) References Cited

U.S. PATENT DOCUMENTS

| | | | | |
|---|---|---|---|---|
| 2,447,789 | A | * | 8/1948 | Barr .............................. 219/422 |
| 4,748,313 | A | * | 5/1988 | de Rudnay ................... 392/391 |
| 5,031,408 | A | * | 7/1991 | Horne et al. .................. 62/48.1 |
| 5,034,604 | A | * | 7/1991 | Streetman et al. ........... 250/251 |
| 5,691,007 | A |   | 11/1997 | Montgomery |
| 6,727,654 | B2 | * | 4/2004 | Ogawa et al. ........... 315/111.01 |
| 2003/0032265 | A1 | * | 2/2003 | Deng ....................... C23C 16/50 438/482 |
| 2004/0226509 | A1 | * | 11/2004 | Hori et al. ..................... 118/715 |
| 2005/0181555 | A1 | * | 8/2005 | Haukka ................. C23C 16/029 438/232 |

(Continued)

FOREIGN PATENT DOCUMENTS

EP        0 561 511       9/1993

OTHER PUBLICATIONS

Vaddiraju et al. "Novel Strategies for the Deposition of -COOH Functionalized Conducting Copolymer Films and the Assembly of Inorganic Nanoparticles on Conducting Polymer Platforms" Adv. Funct. Mater. 2008, 18, 1929-1938.*

(Continued)

*Primary Examiner* — Robert S Walters, Jr.
(74) *Attorney, Agent, or Firm* — Dana M. Gordon; Foley Hoag LLP

(57) ABSTRACT

Described herein are reactors capable of sequentially or simultaneously depositing thin-film polymers onto a substrate by oxidative chemical vapor deposition (oCVD), initiated chemical vapor deposition (iCVD), and plasma-enhanced chemical vapor deposition (PECVD). The single-unit CVD reactors allow for the use of more than one CVD process on the same substrate without the risk of inadvertently exposing the substrate to ambient conditions when switching processes. Furthermore, the ability to deposit simultaneously polymers made by two different CVD processes allows for the exploration of new materials. In addition to assisting in the deposition of polymer films, plasma processes may be used to pretreat substrate surfaces before polymer deposition, or to clean the internal surfaces of the reactor between experiments.

20 Claims, 4 Drawing Sheets

(56) References Cited

U.S. PATENT DOCUMENTS

| | | |
|---|---|---|
| 2006/0269664 A1 | 11/2006 | Gleason et al. |
| 2008/0035059 A1 | 2/2008 | Wang et al. |
| 2011/0305837 A1 | 12/2011 | Lau et al. |
| 2012/0003497 A1* | 1/2012 | Handy et al. ............... 428/615 |

OTHER PUBLICATIONS

International Search Report dated Jun. 17, 2013, from PCT/US2013/027579.
Arkhipov et al., "Development of plasma cleaning techniques for in-vessel optical components in ITER," Journal of Nuclear Materials, 415:S1210-S1213 (2011).
Gupta et al., "Large-scale initiated chemical vapor deposition of poly(glycidyl methacrylate) thin films," Thin Solid Films, 515:1579-1584 (2006).
Pryce Lewis et al., "HWCVD of polymers: Commercialization and scale-up," Thin Solid Films, 517:3551-3554 (2009).
Sungauer et al., "Plasma etching of $HfO_2$ in metal gate CMOS devices," Microelectronic Engineering, 86:965-967 (2009).

* cited by examiner

SINGLE-UNIT REACTOR DESIGN FOR COMBINED OXIDATIVE, INITIATED, AND PLASMA-ENHANCED CHEMICAL VAPOR DEPOSITION

GOVERNMENT SUPPORT

This invention was made with Government support under Grant No. W911NF-07-D-0004 awarded by the Army Research Office. The Government has certain rights in this invention.

BACKGROUND OF THE INVENTION

Materials-processing often involves the deposition of films or layers on a surface of a substrate. One manner of effecting the deposition of such films or layers is through chemical vapor deposition (CVD). CVD involves a chemical reaction of vapor phase chemicals or reactants that contain the constituents to be deposited on the substrate. Reactant gases are introduced into a reaction chamber or reactor, and are decomposed and reacted at a heated surface to form the desired film or layer. There are different methods of CVD; the key distinguishing parameter among them is the type of energy input.

Oxidative chemical vapor deposition (oCVD) can simultaneously polymerize and deposit conjugated polymeric films in a controllable fashion. Moreover, polymers are deposited at low temperatures and without solvent; therefore, this method is compatible with virtually any substrate (that is, the deposition process is independent of the chemical nature and electrical conductivity of the substrates). In addition, the conformal nature of polymer films synthesized by oCVD can be employed uniformly to coat rough surfaces, including micro- or nano-structured substrates. And so, use of oCVD may prevent device shorting in a rough substrate and the method can be used for successful device fabrication on unconventional substrates, like paper. oCVD has been shown to grow uniform and conformal conducting polymers and copolymers on different substrates. Unlike vapor phase polymerization (VPP), where a substrate is pretreated with a layer of oxidant, oCVD involves simultaneous exposure of the substrate to the oxidant and monomer vapors, which makes oCVD more compatible with various substrates. Moreover, the use of vapor deposition removes the requirement that the polymer be soluble. Hence, monomers without soluble side chains can be explored, opening a wider range of materials for consideration as active layers. The simplicity of oCVD can further be extended to patterned films using shadow masking. Thus, synthesis, thin film growth, and patterning are achieved simultaneously, in a process termed "vapor printing."

A second method of CVD is initiated CVD (iCVD). In an iCVD process, thin filament wires are heated, thus supplying the energy to fragment a thermally-labile initiator, thereby forming a radical at moderate temperatures. The use of an initiator not only allows the chemistry to be controlled, but also accelerates film growth and provides molecular-weight and rate control. The energy input is low due to the low filament temperatures, but high growth rates may be achieved.

Finally, plasma-enhanced chemical vapor deposition (PECVD) uses radiofrequency-induced glow discharge to transfer energy to the reactant gases. In certain circumstances one might chose PECVD over other CVD methods due to its higher deposition rates, and the greater ability to control refractive indices. A further advantage of the PECVD method is that the process can take place at temperatures under about 400° C. Furthermore, PECVD processes and systems provide other advantages, such as good adhesion, low pinhole density, good step coverage, adequate electrical properties, and compatibility with fine-line pattern transfer processes.

All of these techniques are useful and have industrial applications to deposition of conformal, pin-hole free functional polymeric thin films with controllable film thickness and functionalities. However, each methodology requires a separate vacuum chamber and associated costs to build and maintain the chamber. Additionally, the fabrication of a single device using all of these methods simultaneously or sequentially is challenging. For example, consecutive deposition on a substrate of three different thin films by iCVD, oCVD, and PECVD requires the operator to transfer the substrate from one chamber to another chamber. As a consequence, time and energy are wasted, and the substrate could be inadvertently exposed to ambient conditions, which is highly undesirable for certain applications.

Therefore, there exists a need for a reactor that is capable of performing all of the aforementioned CVD processes in a single unit chamber.

SUMMARY OF THE INVENTION

In certain embodiments, the invention relates to a single-unit CVD reactor, comprising a chamber, wherein the chamber comprises a substrate stage, a crucible, an electrode, a filament, and an inlet; and the chamber is operably connected to a vacuum source.

In certain embodiments, the invention relates to any one of the aforementioned single-unit CVD reactors, wherein the single-unit CVD reactor further comprises a window, a door, or a lid on the chamber.

In certain embodiments, the invention relates to any one of the aforementioned single-unit CVD reactors, wherein the chamber is substantially cylindrical in shape.

In certain embodiments, the invention relates to any one of the aforementioned single-unit CVD reactors, wherein the chamber comprises glass or stainless steel.

In certain embodiments, the invention relates to any one of the aforementioned single-unit CVD reactors, wherein the substrate stage is operably connected to a heat source or a cooling source.

In certain embodiments, the invention relates to any one of the aforementioned single-unit CVD reactors, wherein the substrate stage is operably connected to a DC power supply.

In certain embodiments, the invention relates to any one of the aforementioned single-unit CVD reactors, wherein the crucible is operably connected to a heat source.

In certain embodiments, the invention relates to any one of the aforementioned single-unit CVD reactors, wherein the electrode is a microwave frequency electrode, a DC electrode, or a radiofrequency electrode.

In certain embodiments, the invention relates to any one of the aforementioned single-unit CVD reactors, wherein the electrode is a radiofrequency electrode; and the radiofrequency electrode comprises a metal.

In certain embodiments, the invention relates to any one of the aforementioned single-unit CVD reactors, wherein the chamber comprises a plurality of filaments.

In certain embodiments, the invention relates to any one of the aforementioned single-unit CVD reactors, wherein the filaments are spaced from about 1 mm apart to about 30 mm apart.

In certain embodiments, the invention relates to any one of the aforementioned single-unit CVD reactors, wherein the filament is from about 0.1 cm to about 20 cm from the substrate stage.

In certain embodiments, the invention relates to any one of the aforementioned single-unit CVD reactors, wherein the filament comprises a metal.

In certain embodiments, the invention relates to any one of the aforementioned single-unit CVD reactors, wherein the filament is from about 0.01 cm to about 0.1 cm in diameter.

In certain embodiments, the invention relates to any one of the aforementioned single-unit CVD reactors, wherein the pressure is from about 5 mtorr to about 760 torr.

In certain embodiments, the invention relates to a method of forming a polymer coating on a surface of a substrate comprising the steps of:
  (a) contacting the substrate with the substrate stage of any one of the aforementioned single-unit CVD reactors;
  (b) reducing the pressure in the chamber;
  (c) introducing a monomer gas into the chamber by way of an inlet; and
  (d) any one or more of
    (i) introducing an oxidant into the chamber;
    (ii) introducing an initiator into the chamber by way of an inlet; and applying power to the filament; or
    (iii) introducing a plasma precursor; and applying power to the electrode.

In certain embodiments, the invention relates to any one of the aforementioned methods, wherein step (d) comprises at least (i) introducing an oxidant into the chamber; and the method further comprises the step of introducing a base into the chamber.

In certain embodiments, the invention relates to any one of the aforementioned methods, further comprising the step of heating the crucible.

DETAILED DESCRIPTION OF THE INVENTION

Overview

Figure 1:
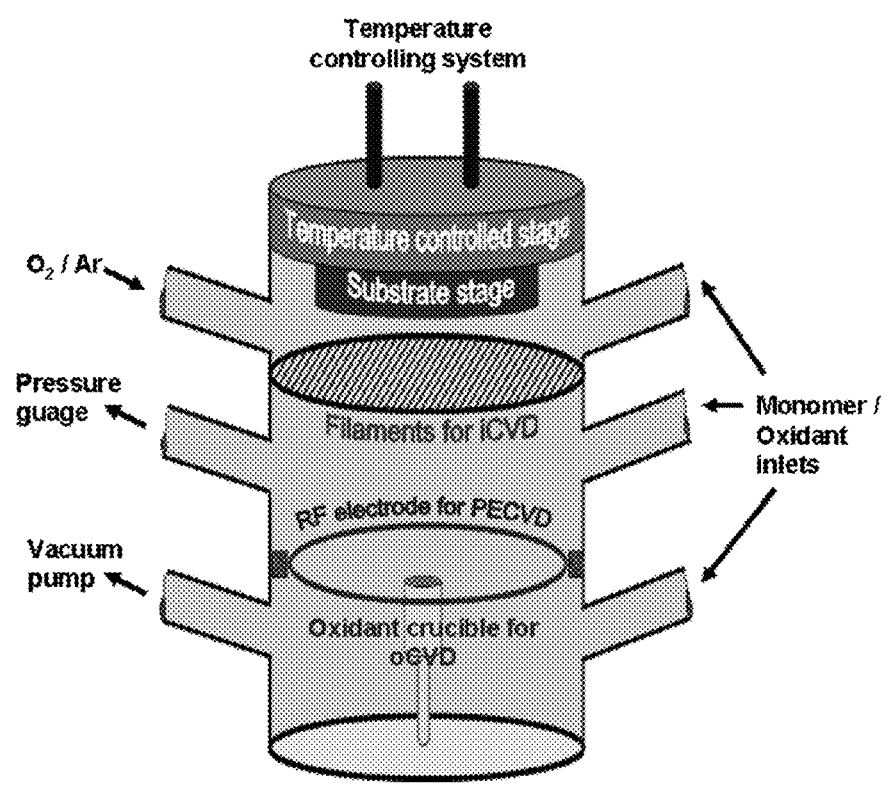
FIG. 1 depicts a schematic representation of an exemplary single unit CVD chamber. The chamber enables depositing thin polymeric films sequentially and simultaneously by oxidative, initiated, and plasma-enhanced chemical vapor depositions.
Figure 2:
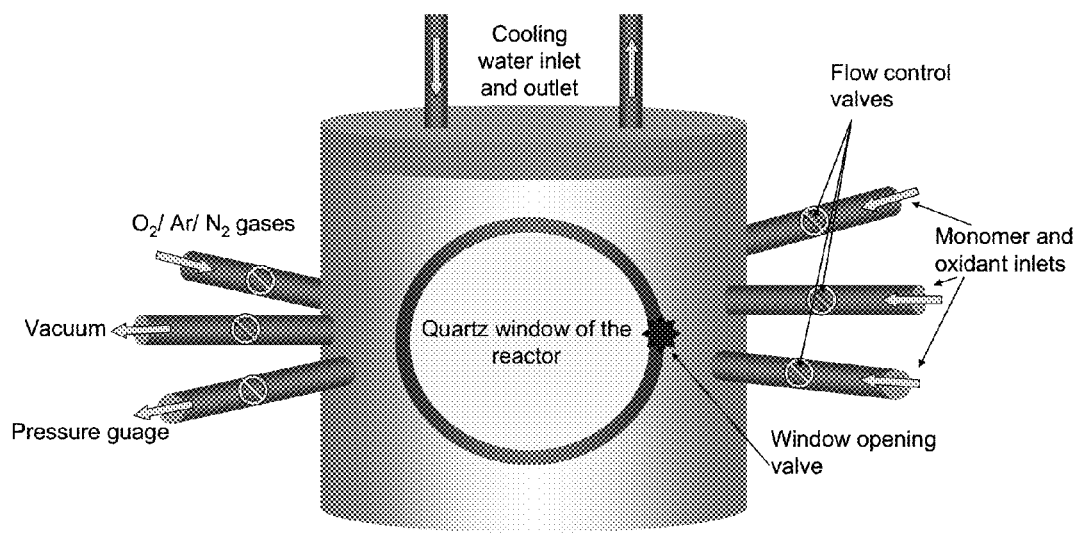
FIG. 2 depicts a schematic representation of a single-unit CVD chamber, external view.
Figure 3:
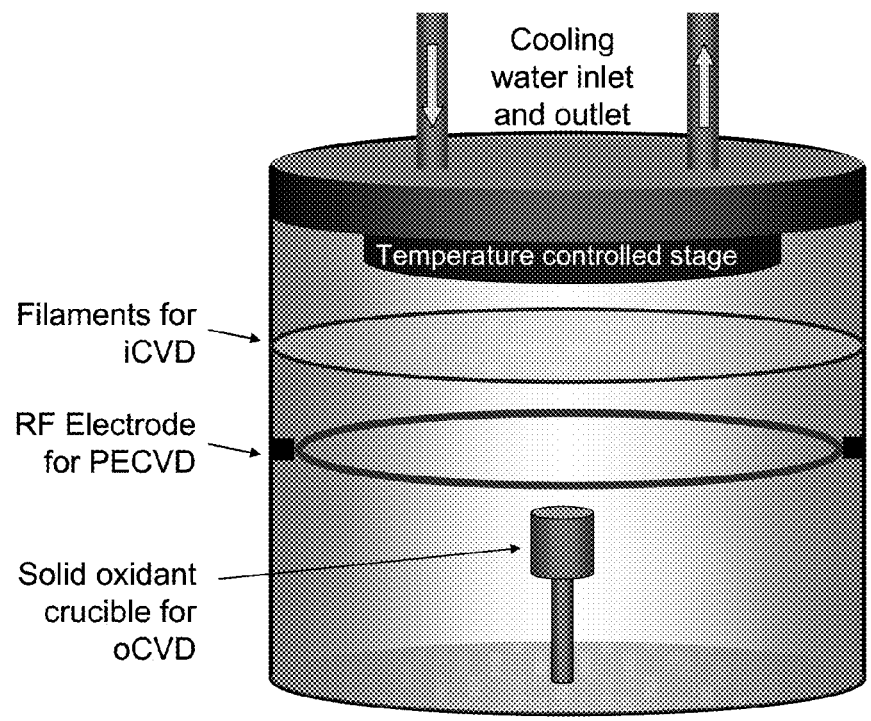
FIG. 3 depicts a schematic representation of a single-unit CVD chamber, internal view.

In certain embodiments, the invention relates to a single-unit CVD reactor.

In certain embodiments, the invention relates to a method of depositing a film onto a substrate comprising the step of placing the substrate into any one of the aforementioned single-unit CVD reactors. In certain embodiments, the film is deposited onto the substrate by oCVD, iCVD, or PECVD. In certain embodiments, a plurality of films is deposited sequentially onto the substrate by oCVD, iCVD, or PECVD, in any order. In certain embodiments, a plurality of films is deposited sequentially onto the substrate by oCVD, iCVD, or PECVD, in any order without disturbing the substrate and the pressure of the reactor. In certain embodiments, the risk that a coated substrate will be exposed to the ambient environment between any two consecutive depositions is minimized.

In certain embodiments, the invention relates to a method of depositing a film onto a substrate comprising the step of placing the substrate into any one of the aforementioned single-unit CVD reactors. In certain embodiments, the invention relates to a method of depositing various types of homogeneous, heterogeneous, composite and/or hybrid structures by simultaneous operation of any two or all of the CVD processes at any time.

In certain embodiments, the invention relates to a single-unit CVD reactor that is easy to clean. Typically, the inside of a CVD reactor will be coated with a thin film after deposition when oCVD or iCVD processes are employed. The materials deposited on the inside walls of the reactor could be a potential source of cross-contamination between any two consecutive deposition processes if two different starting organic compounds were selected. Therefore, it is essential to remove any monomeric, oligomeric or polymeric deposition from inside the reactor and feed lines in order to prevent cross-contamination and to make the process reproducible. Usually, reactors are heated at high temperatures for long times in order to remove any contaminant from previous depositions. The high temperature effectively removes any volatile monomers or oligomers from the reactor. However, low volatile or non-volatile organic and inorganic materials are very difficult to get rid-off by simply employing this practice.

However, plasma cleaning is a well-known procedure in the semiconductor industry. Therefore, addition of PECVD features in a single-unit CVD reactor may be used to clean the reactor by oxygen or argon plasma. In certain embodiments, this feature minimizes contamination from previous depositions.

In certain embodiments, availability of all the oCVD, iCVD, and PECVD features in the same unit reduces the initial set up costs.

Definitions

For convenience, certain terms employed in the specification, examples, and appended claims are collected here.

The term "copolymer" as used herein means a polymer of two or more different monomers.

"CVD" as used herein is an abbreviation for chemical vapor deposition.

"Energy Source", as used herein, refers to the method of energy input into a gaseous system capable of activating precursor gas species so as to render them capable of forming a coating on the deposition substrate. Example energy sources include, but are not limited to, heated filaments, ionic plasma excitation, gamma irradiation, ultraviolet irradiation, infrared irradiation, and electron beam excitation.

"Filament", as used herein, refers to resistively heated lengths of material capable of one or more of the following: thermal excitation of precursor gases, evaporative transfer of metal to the deposition substrate, or convective or radiative heating of the substrate.

"Inert Gas", as used herein, refers to a gas or gases that are not reactive under reaction conditions within the vacuum chamber.

As used herein, the term "surface" or "surfaces" or "substrates" can mean any surface of any material, including glass, plastics, metals, polymers, paper, fabric and the like. It can include surfaces constructed out of more than one material, including coated surfaces. Importantly, all surfaces/substrates of the invention can react with the oxidants/ catalysts of the invention, resulting in the covalent attachment of the polymer coating to the surface/substrate.

Oxidative Chemical Vapor Deposition

In certain embodiments, oxidative chemical vapor deposition takes place in a reactor. In certain embodiments, precursor molecules, consisting essentially of a chemical metal-containing oxidant and a monomer species, are fed into the reactor. In certain embodiments, a variety of monomer species may be polymerized and deposited by oCVD; these monomer species are well-known in the art. In certain embodiments, this process occurs at a range of pressures from atmospheric pressure to low vacuum. In certain embodiments, the pressure is from about 5 mtorr to about 760 torr. In certain embodiments, the pressure is from about 5 mtorr to about 500 mtorr. In certain embodiments, the pressure is about 5 mtorr, about 10 mtorr, about 15 mtorr, about 30 mtorr, about 50 mtorr, about 75 mtorr, about 100 mtorr, about 125 mtorr, about 150 mtorr, about 175 mtorr, about 200 mtorr, about 225 mtorr, about 250 mtorr, about 275 mtorr, about 300 mtorr, about 325 mtorr, about 350 mtorr, about 375 mtorr, about 400 mtorr, about 425 mtorr, about 450 mtorr, about 475 mtorr, about 500 mtorr, about 600 mtorr, about 700 mtorr, about 800 mtorr, about 900 mtorr, about 1 torr, about 2 torr, about 3 torr, about 4 torr, about 5 torr, about 6 torr, about 7 torr, about 8 torr, about 9 torr, or about 10 torr.

In certain embodiments, chemical metal-containing oxidant species are heavy, but can be sublimed onto a substrate surface using a carrier gas and a heated, porous crucible installed inside the reactor. In certain embodiments, carrier gases and metal-containing oxidants useful in oCVD are well-known in the art. In certain embodiments, evaporation of the oxidant takes place in a resistively heated container inside the reaction chamber. In certain embodiments, evaporation of the oxidant takes place in a resistively heated container inside the reaction chamber underneath the substrate surface to be coated. In certain embodiments, the monomer species is delivered from a source external to the reactor. In certain embodiments, the metal-containing oxidant forms a thin, conformational layer on the substrate surface, which reacts with monomer molecules as they adsorb. Oxidants in the vapor form can also be delivered for this polymerization process, for example, bromine ($Br_2$) and transition-metal-containing liquid oxidants (e.g., $VOCl_3$, $VOCl_4$).

In certain embodiments, acid-catalyzed side reactions may be reduced or eliminated using one or more the following techniques: introducing a base, including but not limited to pyridine, to react with any acid that is formed in situ; heating the substrate to temperatures above about 60° C., about 70° C., about 80° C. or about 90° C., for example, to accelerate evaporation of the acid as it is formed; and biasing the substrate with a positive charge using a DC power supply to favor the oxidation of monomeric and oligomeric species adsorbed on the substrate.

Initiated Chemical Vapor Deposition

In certain embodiments, iCVD takes place in a reactor. In certain embodiments, a variety of monomer species may be polymerized and deposited by iCVD; these monomer species are well-known in the art. In certain embodiments, the surface to be coated is placed on a stage in the reactor and gaseous precursor molecules are fed into the reactor; the stage may be the bottom of the reactor and not a separate entity. In certain embodiments, a variety of carrier gases useful in iCVD; these carrier gases are well-known in the art.

In certain embodiments, the iCVD reactor has automated electronics to control reactor pressure and to control reactant flow rates. In certain embodiments, any unreacted vapors may be exhausted from the system.

In certain embodiments, the iCVD coating process can take place at a range of pressures from atmospheric pressure to low vacuum. In certain embodiments, the pressure is less than about 50 torr. In certain embodiments, the pressure is less than about 40 torr. In certain embodiments, the pressure is less than about 30 torr. In certain embodiments, the pressure is less than about 20 torr. In certain embodiments, the pressure is less than about 10 torr. In certain embodiments, the pressure is less than about 5 torr. In certain embodiments, the pressure is less than about 1 torr. In certain embodiments, the pressure is less than about 0.7 torr. In certain embodiments, the pressure is less than about 0.4 torr. In certain embodiments, the pressure is about 50 torr. In certain embodiments, the pressure is about 40 torr. In certain embodiments, the pressure is about 30 torr. In certain embodiments, the pressure is about 20 torr. In certain embodiments, the pressure is about 10 torr. In certain embodiments, the pressure is about 5 torr. In certain embodiments, the pressure is about 1 torr. In certain embodiments, the pressure is about 0.7 torr. In certain embodiments, the pressure is about 0.4 torr. In certain embodiments the pressure is about 1 torr; about 0.9 torr; about 0.8 torr; about 0.7 torr; about 0.6 torr; about 0.5 torr; about 0.4 torr; about 0.3 torr; about 0.2 torr; or about 0.1 torr. In certain embodiments, the pressure is greater than about 1 mtorr.

In certain embodiments, the flow rate of the monomer can be adjusted in the iCVD method. In certain embodiments, the monomer flow rate is about 100 sccm (standard cubic centimeters per minute). In certain embodiments, the monomer flow rate is about 90 sccm. In certain embodiments, the monomer flow rate is about 80 sccm. In certain embodiments the monomer flow rate is about 70 sccm. In certain embodiments, the monomer flow rate is about 60 sccm. In certain embodiments, the monomer flow rate is about 50 sccm. In certain embodiments, the monomer flow rate is about 40 sccm. In certain embodiments, the monomer flow rate is about 30 sccm. In certain embodiments, the monomer flow rate is about 20 sccm. In certain embodiments, the monomer flow rate is less than about 100 sccm. In certain embodiments, the monomer flow rate is less than about 90 sccm. In certain embodiments, the monomer flow rate is less than about 80 sccm. In certain embodiments, the monomer flow rate is less than about 70 sccm. In certain embodiments, the monomer flow rate is less than about 60 sccm. In certain embodiments, the monomer flow rate is less than about 50 sccm. In certain embodiments, the monomer flow rate is less than about 40 sccm. In certain embodiments, the monomer flow rate is less than about 30 sccm. In certain embodiments, the monomer flow rate is less than about 20 sccm. In certain embodiments, the monomer flow rate is about 10 sccm. In certain embodiments, the flow rate is less than about 10 sccm. In certain embodiments, the monomer flow rate is about 5 sccm. In certain embodiments, the flow rate is less than about 5 sccm. In certain embodiments, the monomer flow rate is about 3 sccm. In certain embodiments, the flow rate is less than about 3 sccm. In certain embodiments, the monomer flow rate is about 1.5 sccm. In certain embodiments, the flow rate is less than about 1.5 sccm. In certain embodiments, the monomer flow rate is about 0.75 sccm. In certain embodiments, the flow rate is less than about 0.75 sccm. In certain embodiments, the flow rate is greater than about 0.5 sccm. When more than one monomer is used (i.e.

to deposit co-polymers), the flow rate of the additional monomers, in certain embodiments, may be the same as those presented above.

In certain embodiments, the flow rate of the initiator can be adjusted in the iCVD method. In certain embodiments the initiator flow rate is about 100 sccm. In certain embodiments, the initiator flow rate is about 90 sccm. In certain embodiments, the initiator flow rate is about 80 sccm. In certain embodiments, the initiator flow rate is about 70 sccm. In certain embodiments, the initiator flow rate is about 60 sccm. In certain embodiments, the initiator flow rate is about 50 sccm. In certain embodiments, the initiator flow rate is about 40 sccm. In certain embodiments, the initiator flow rate is about 30 sccm. In certain embodiments, the initiator flow rate is about 20 sccm. In certain embodiments, the initiator flow rate is less than about 100 sccm. In certain embodiments, the initiator flow rate is less than about 90 sccm. In certain embodiments, the initiator flow rate is less than about 80 sccm. In certain embodiments, the initiator flow rate is less than about 70 sccm. In certain embodiments, the initiator flow rate is less than about 60 sccm. In certain embodiments, the initiator flow rate is less than about 50 sccm. In certain embodiments, the initiator flow rate is less than about 40 sccm. In certain embodiments, the initiator flow rate is less than about 30 sccm. In certain embodiments, the initiator flow rate is less than about 20 sccm. In certain embodiments, the initiator flow rate is about 10 sccm. In certain embodiments, the flow rate is less than about 10 sccm. In certain embodiments, the initiator flow rate is about 5 sccm. In certain embodiments, the flow rate is less than about 5 sccm. In certain embodiments, the initiator flow rate is about 3 sccm. In certain embodiments, the flow rate is less than about 3 sccm. In certain embodiments, the initiator flow rate is about 1.5 sccm. In certain embodiments, the flow rate is less than about 1.5 sccm. In certain embodiments, the initiator flow rate is about 0.75 sccm. In certain embodiments, the flow rate is less than about 0.75 sccm. In certain embodiments, the flow rate is greater than about 0.5 sccm. In certain embodiments, a variety of initiators are useful in iCVD; these initiators are well-known in the art.

In certain embodiments, the carrier gas is an inert gas. In certain embodiments, the carrier gas is nitrogen or argon.

In certain embodiments, the flow rate of the carrier gas can be adjusted in the iCVD method. In certain embodiments, the carrier gas flow rate is about 1000 sccm. In certain embodiments, the carrier gas flow rate is about 900 sccm. In certain embodiments, the carrier gas flow rate is about 800 sccm. In certain embodiments, the carrier gas flow rate is about 700 sccm. In certain embodiments, the carrier gas flow rate is about 600 sccm. In certain embodiments, the carrier gas flow rate is about 500 sccm. In certain embodiments, the carrier gas flow rate is about 400 sccm. In certain embodiments, the carrier gas flow rate is about 300 sccm. In certain embodiments, the carrier gas flow rate is about 200 sccm. In certain embodiments, the carrier gas flow rate is about 100 sccm. In certain embodiments, the carrier gas flow rate is about 90 sccm. In certain embodiments, the carrier gas flow rate is about 80 sccm. In certain embodiments, the carrier gas flow rate is about 70 sccm. In certain embodiments, the carrier gas flow rate is about 60 sccm. In certain embodiments, the carrier gas flow rate is about 50 sccm. In certain embodiments, the carrier gas flow rate is about 40 sccm. In certain embodiments, the carrier gas flow rate is about 30 sccm. In certain embodiments, the carrier gas flow rate is about 20 sccm. In certain embodiments, the carrier gas flow rate is less than about 1000 sccm. In certain embodiments, the carrier gas flow rate is less than about 900 sccm. In certain embodiments, the carrier gas flow rate is less than about 800 sccm. In certain embodiments, the carrier gas flow rate is less than about 700 sccm. In certain embodiments, the carrier gas flow rate is less than about 600 sccm. In certain embodiments, the carrier gas flow rate is less than about 500 sccm. In certain embodiments, the carrier gas flow rate is less than about 400 sccm. In certain embodiments, the carrier gas flow rate is less than about 300 sccm. In certain embodiments, the carrier gas flow rate is less than about 200 sccm. In certain embodiments, the carrier gas flow rate is less than about 100 sccm. In certain embodiments, the carrier gas flow rate is less than about 90 sccm. In certain embodiments, the carrier gas flow rate is less than about 80 sccm. In certain embodiments, the carrier gas flow rate is less than about 70 sccm. In certain embodiments, the carrier gas flow rate is less than about 60 sccm. In certain embodiments the carrier gas flow rate is less than about 50 sccm. In certain, embodiments the carrier gas flow rate is less than about 40 sccm. In certain embodiments, the carrier gas flow rate is less than about 30 sccm. In certain embodiments, the carrier gas flow rate is less than about 20 sccm. In certain embodiments, the carrier gas flow rate is about 10 sccm. In certain embodiments, the flow rate is less than about 10 sccm. In certain embodiments, the carrier gas flow rate is about 5 sccm. In certain embodiments, the flow rate is less than about 5 sccm. In certain embodiments, the flow rate is greater than about 4 sccm.

In certain embodiments, the temperature of the filament can be adjusted in the iCVD method. In certain embodiments the temperature of the filament is about 350° C. In certain embodiments the temperature of the filament is about 300° C. In certain embodiments the temperature of the filament is about 250° C. In certain embodiments the temperature of the filament is about 245° C. In certain embodiments the temperature of the filament is about 235° C. In certain embodiments the temperature of the filament is about 225° C. In certain embodiments the temperature of the filament is about 200° C. In certain embodiments the temperature of the filament is about 150° C. In certain embodiments the temperature of the filament is about 100° C.

In certain embodiments, the filament is from about 0.1 cm to about 20 cm from the substrate stage. In certain embodiments, the filament is about 0.1 cm, about 0.2 cm, about 0.3 cm, about 0.4 cm, about 0.5 cm, about 0.6 cm, about 0.7 cm, about 0.8 cm, about 0.9 cm, about 1.0 cm, about 1.1 cm, about 1.2 cm, about 1.3 cm, about 1.4 cm, about 1.5 cm, about 1.6 cm, about 1.7 cm, about 1.8 cm, about 1.9 cm, about 2.0 cm, about 2.1 cm, about 2.2 cm, about 2.3 cm, about 2.4 cm, about 2.5 cm, about 3.0 cm, about 3.5 cm, about 4.0 cm, about 4.5 cm, about 5.0 cm, about 5.5 cm, about 6.0 cm, about 6.5 cm, about 7.0 cm, about 7.5 cm, about 8.0 cm, about 8.5 cm, about 9.0 cm, about 9.5 cm, about 10 cm, about 11 cm, about 12 cm, about 13 cm, about 14 cm, about 15 cm, about 16 cm, about 17 cm, about 18 cm, about 19 cm, or about 20 cm from the substrate stage. In certain embodiments, the filament is about 1.4 cm from the substrate stage.

In certain embodiments, the filament is oriented in any orientation with respect to the substrate stage or the chamber. In certain embodiments, the filament is oriented above the substrate stage, below the substrate stage, or beside the substrate stage.

In certain embodiments, the iCVD coating process can take place at a range of temperatures of the substrate stage. In certain embodiments, the temperature of the substrate stage is ambient temperature. In certain embodiments, the temperature of the substrate stage is about 25° C.; in yet other embodiments the temperature of the substrate stage is between about 25° C. and about 100° C., or between about 0° C. and about 25° C. In certain embodiments said temperature of the substrate stage is controlled by water.

In certain embodiments, reactor conditions are about 0.4 torr pressure, about 1.5 sccm monomer flow, about 0.2 sccm initiator flow, about 235° C. filament temperature, and about 25° C. water temperature.

In certain embodiments, the rate of polymer deposition is about 1 micron/minute. In certain embodiments, the rate of polymer deposition is between about 1 micron/minute and about 50 nm/minute. In certain embodiments, the rate of polymer deposition is between about 10 micron/minute and about 50 nm/minute. In certain embodiments, the rate of polymer deposition is between about 100 micron/minute and about 50 nm/minute. In certain embodiments, the rate of polymer deposition is between about 1 nm/minute and about 50 nm/minute. In certain embodiments, the rate of polymer deposition is between about 10 nm/minute and about 50 nm/minute. In certain embodiments, the rate of polymer deposition is between about 10 nm/minute and about 25 nm/minute.

Plasma-Enhanced Chemical Vapor Deposition

In certain embodiments, plasma enhanced CVD (PECVD) is used. In certain embodiments, precursor components (often diluted in carrier gases) are delivered into the reaction chamber at approximately ambient temperatures. As they pass over or come into contact with a heated substrate, they react or decompose, forming a solid phase, which is deposited onto the substrate. The substrate temperature can influence the reactions that will take place. Methods and materials used for PECVD are well known in the art and can be adapted for use in the present invention (See, for example, U.S. Pat. No. 6,410,463, which is hereby incorporated by reference).

In certain embodiments, the plasma excitation timing can be continuous. In certain embodiments, the plasma excitation timing can be pulsed. Control of the pulse excitation timing has been shown to be effective in tuning the properties of the resulting film. The power can used can be varied depending upon the precursors used. In certain embodiments, a peak rf power between about 100 W and 1500 W can be used. For example, in continuous-wave runs, 100 W and 56 W of power can be applied continuously for the duration of the run. In certain embodiments, up to 1500 W can be applied continuously. In certain embodiments, about 40 W, about 50 W, about 60 W, about 70 W, about 80 W, about 90 W, about 100 W, about 200 W, about 300 W, about 400 W, about 500 W, about 600 W, about 700 W, about 800 W, about 900 W, about 1000 W, about 1100 W, about 1200 W, about 1300 W, about 1400 W, or about 1500 W are applied continuously. For pulsed-PECVD runs, a peak rf power of 120 W can be applied during on-time excitation. Power modulation can be achieved using a pulse generator. On-times can be varied from 10 to 100 ms, while off-times can vary between 0 to 1200 ms.

In certain embodiments, microwave plasma is used.

In certain embodiments, plasma excitation of oxygen or air is employed for etching organic layers or for cleaning surfaces. Thus, in certain embodiments, plasma excitation is used to clean the surface of the substrate prior to deposition of a polymer coating on a substrate. Such plasma pretreatment is a well-known method of increasing adhesion to the surface of a substrate.

In certain embodiments, oxygen or air plasma is used to clean the interior surfaces of the chamber. In many cases, deposition of organic films occurs not only on the substrate, but on the interior walls and interior of the window, door, or lid of the reaction chamber. In certain embodiments, plasma cleaning is used to remove the film deposited onto the interior surfaces of the chamber from a previous experiment, so that the chamber is clean before starting a new deposition process.

Exemplary Single-Unit CVD Reactors of the Invention

In certain embodiments, the invention relates to a single-unit CVD reactor, comprising a chamber, wherein the chamber comprises a substrate stage, a crucible, an electrode, a filament, and an inlet; and the chamber is operably connected to a vacuum source.

In certain embodiments, the invention relates to any one of the aforementioned single-unit CVD reactors, wherein the substrate stage, the crucible, the electrode, and the filament are located within the chamber. In certain embodiments, the invention relates to any one of the aforementioned single-unit CVD reactors, wherein the electrode is located outside of the chamber.

In certain embodiments, the invention relates to any one of the aforementioned single-unit CVD reactors, wherein the single-unit CVD reactor further comprises a window, a door, or a lid on the chamber. In certain embodiments, the invention relates to any one of the aforementioned single-unit CVD reactors, wherein the single-unit CVD reactor further comprises a window. In certain embodiments, the invention relates to any one of the aforementioned single-unit CVD reactors, wherein the window is quartz or borosilicate glass. In certain embodiments, the invention relates to any one of the aforementioned single-unit CVD reactors, wherein the window or the door may be opened from the outside of the single-unit CVD reactor. In certain embodiments, the invention relates to any one of the aforementioned single-unit CVD reactors, wherein the single-unit CVD reactor further comprises a lid. In certain embodiments, the invention relates to any one of the aforementioned single-unit CVD reactors, wherein the single-unit CVD reactor further comprises a lid; and the lid is a quartz plate or borosilicate glass.

In certain embodiments, the invention relates to any one of the aforementioned single-unit CVD reactors, wherein the chamber is substantially cylindrical in shape. In certain embodiments, the invention relates to any one of the aforementioned single-unit CVD reactors, wherein the chamber is substantially cylindrical in shape; and the outside of the cylinder has a height of about 3 cm. In certain embodiments, the invention relates to any one of the aforementioned single-unit CVD reactors, wherein the chamber is substantially cylindrical in shape; and the outside of the cylinder has a height of about 3.3 cm. In certain embodiments, the invention relates to any one of the aforementioned single-unit CVD reactors, wherein the chamber is substantially cylindrical in shape; and the outside of the cylinder has a height of about 1 cm to about 2 m, about 50 cm to about 2 m, or about 1 m to about 2 m. In certain embodiments, the invention relates to any one of the aforementioned single-unit CVD reactors, wherein the chamber is substantially cylindrical in shape; and the outside of the cylinder has a height of about 1 cm, about 2 cm, about 3 cm, about 4 cm, about 5 cm, about 6 cm, about 7 cm, about 8 cm, about 9 cm, about 10 cm, about 20 cm, about 30 cm, about 40 cm, about 50 cm, about 60 cm, about 70 cm, about 80 cm, about 90 cm, about 1 m, about 1.25 m, about 1.5 m, about 1.75 m, or about 2 m.

In certain embodiments, the invention relates to any one of the aforementioned single-unit CVD reactors, wherein the chamber is substantially cylindrical in shape; and cylinder has an external radius of about 15 cm to about 4 m, about 50 cm to about 4 m, about 1 m to about 4 m, about 2 m to about 4 m, or about 1 m to about 2 m. In certain embodiments, the external radius is about 4 m, about 3.5 m, about 3 m, about 2.5 m, about 2 m, about 1.5 m, about 1 m, about 50 cm, about 40 cm, about 30 cm, about 20 cm, or about 15 cm. In certain embodiments, the external radius is about 1.5 m. In certain embodiments, the invention relates to any one of the aforementioned single-unit CVD reactors, wherein the chamber is substantially cylindrical in shape; and cylinder has an external radius of about 12 cm. In certain embodiments, the invention relates to any one of the aforementioned single-unit CVD reactors, wherein the chamber is substantially cylindrical in shape; and cylinder has an external radius of about 5 cm to about 30 cm. In certain embodiments, the invention relates to any one of the aforementioned single-unit CVD reactors, wherein the chamber is substantially cylindrical in shape; and cylinder has an external radius of about 5 cm, about 6 cm, about 7 cm, about 8 cm, about 9 cm, about 10 cm, about 11 cm, about 12 cm, about 13 cm, about 14 cm, about 15 cm, about 16 cm, about 17 cm, about 18 cm, about 19 cm, about 20 cm, about 21 cm, about 22 cm, about 23 cm, about 24 cm, about 25 cm, about 26 cm, about 27 cm, about 28 cm, about 29 cm, or about 30 cm.

In certain embodiments, the invention relates to any one of the aforementioned single-unit CVD reactors, wherein the external dimensions of the cylinder are larger than the internal dimensions of the cylinder.

In certain embodiments, the invention relates to any one of the aforementioned single-unit CVD reactors, wherein the chamber is cubic. In certain embodiments, the invention relates to any one of the aforementioned single-unit CVD reactors, wherein the chamber is a rectangular cube. In certain embodiments, the invention relates to any one of the aforementioned single-unit CVD reactors, wherein the chamber is a rectangular cube; and the largest dimension of the rectangular cube is from about 1 cm to about 3.5 m. In certain embodiments, the invention relates to any one of the aforementioned single-unit CVD reactors, wherein the chamber is a rectangular cube; and the largest dimension of the rectangular cube is about 10 cm. In certain embodiments, the invention relates to any one of the aforementioned single-unit CVD reactors, wherein the chamber is a rectangular cube; and the largest dimension of the rectangular cube is about 1.2 m. In certain embodiments, the invention relates to any one of the aforementioned single-unit CVD reactors, wherein the chamber is a rectangular cube; and the largest dimension of the rectangular cube is about 1 cm, about 2 cm, about 3 cm, about 4 cm, about 5 cm, about 6 cm, about 7 cm, about 8 cm, about 9 cm, about 10 cm, about 20 cm, about 30 cm, about 40 cm, about 50 cm, about 60 cm, about 70 cm, about 80 cm, about 90 cm, about 1 m, about 1.2 m, about 1.4 m, about 1.6 m, about 1.8 m, about 2.0 m, about 2.5 m, about 3 m, or about 3.5 m. In certain embodiments, the invention relates to any one of the aforementioned single-unit CVD reactors, wherein the chamber is a rectangular cube; and the smallest dimension of the rectangular cube is greater than about 1 cm.

Figure 4:
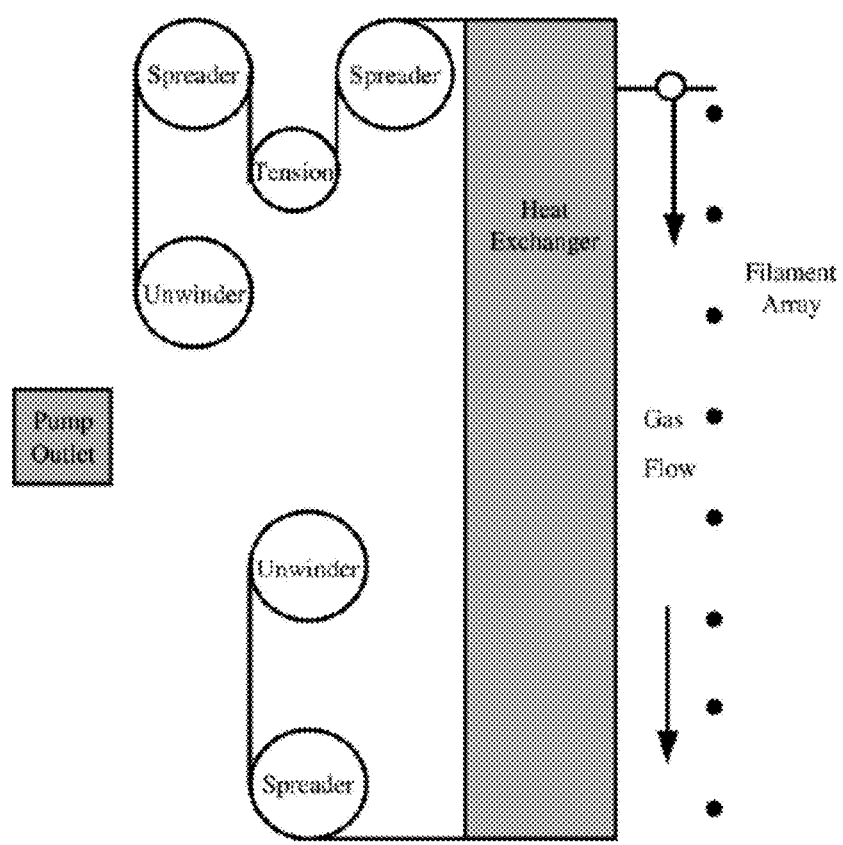
FIG. 4 depicts a roll-to-roll modification of a single-unit CVD chamber.

In certain embodiments, the invention relates to any one of the aforementioned single-unit CVD reactors, wherein the chamber is a rectangular cube. In certain embodiments, the chamber is a roll-to-roll vacuum chamber. In certain dimensions, the internal volume of the roll-to-roll chamber is 0.16 m$^3$. In certain embodiments, the chamber comprises an unwinder roll, at least three spreader rolls, a tension roll, and a rewinder roll. In certain embodiments, the spreader rolls prevent wrinkling. In certain embodiments, any one of the rolls is less than about 30 cm in length. In certain embodiments, any one of the rolls is less than about 16 cm in diameter. In certain embodiments, the chamber further comprises a heat exchanger. In certain embodiments, the heat exchanger comprises stainless steel. In certain embodiments, the heat exchanger is situated between the filament and the rolls. In certain embodiments, the heat exchanger is about 35 cm×43 cm. In certain embodiments, the heat exchanger cools the substrate. In certain embodiments, the heat exchanger directs the flow of inlet gases. In certain embodiments, the width of the heat exchanger substantially spans the depth of the chamber. In certain embodiments, the heat exchanger is the substrate stage, or the substrate stage is the heat exchanger. In certain embodiments, the chamber further comprises a distributor tube. In certain embodiments, the distributor tube is about 30 cm long and about 1.3 cm in diameter. In certain embodiments, the distributor tube comprises a plurality of holes. In certain embodiments, the distributor tube comprises about 10 holes. In certain embodiments, the holes are about 1 mm in diameter. In certain embodiments, the distributor tube distributes gases across substantially across the entire width of the substrate stage. See FIG. 4.

In certain embodiments, the invention relates to any one of the aforementioned single-unit CVD reactors, wherein the chamber is bell-shaped.

In certain embodiments, the invention relates to any one of the aforementioned single-unit CVD reactors, wherein the chamber is grounded.

In certain embodiments, the invention relates to any one of the aforementioned single-unit CVD reactors, wherein the chamber comprises glass or stainless steel.

In certain embodiments, the invention relates to any one of the aforementioned single-unit CVD reactors, wherein the single-unit CVD reactor further comprises a pressure gauge.

In certain embodiments, the invention relates to any one of the aforementioned single-unit CVD reactors, wherein the substrate stage is operably connected to a heat source or a cooling source.

In certain embodiments, the invention relates to any one of the aforementioned single-unit CVD reactors, wherein the substrate stage is operably connected to a cooling source. In certain embodiments, the invention relates to any one of the aforementioned single-unit CVD reactors, wherein the cooling source is water flow. In certain embodiments, the invention relates to any one of the aforementioned single-unit CVD reactors, wherein the cooling source is ethylene glycol flow. In certain embodiments, the invention relates to any one of the aforementioned single-unit CVD reactors, wherein the cooling source is flow of a solution comprising water and ethylene glycol. In certain embodiments, the invention relates to any one of the aforementioned single-unit CVD reactors, wherein the cooling source is water flow through internal coils.

In certain embodiments, the invention relates to any one of the aforementioned single-unit CVD reactors, wherein the substrate stage is operably connected to a heat source.

In certain embodiments, the invention relates to any one of the aforementioned single-unit CVD reactors, wherein the substrate stage is maintained at a temperature of from about 10° C. to about 200° C. In certain embodiments, the invention relates to any one of the aforementioned single-unit CVD reactors, wherein the substrate stage is heated at a temperature of about 10° C., about 20° C., about 30° C., about 40° C., about 50° C., about 60° C., about 70° C., about 80° C., about 90° C., about 100° C., about 110° C., about 120° C., about 130° C., about 140° C., about 150° C., about 160° C., about 170° C., about 180° C., about 190° C., or about 200° C.

In certain embodiments, the invention relates to any one of the aforementioned single-unit CVD reactors, wherein the substrate stage is operably connected to a DC power supply.

In certain embodiments, the invention relates to any one of the aforementioned single-unit CVD reactors, wherein the substrate stage is oriented above the other components in the chamber. In certain embodiments, the invention relates to any one of the aforementioned single-unit CVD reactors, wherein the substrate stage is oriented above the crucible. In certain embodiments, the invention relates to any one of the aforementioned single-unit CVD reactors, wherein the substrate stage is flat or slightly convex.

In certain embodiments, the invention relates to any one of the aforementioned single-unit CVD reactors, wherein the crucible is operably connected to a heat source. In certain embodiments, the invention relates to any one of the aforementioned single-unit CVD reactors, wherein the crucible is heated at a temperature of from about 50° C. to about 400° C. In certain embodiments, the invention relates to any one of the aforementioned single-unit CVD reactors, wherein the crucible is heated at a temperature of about 50° C., about 60° C., about 70° C., about 80° C., about 90° C., about 100° C., about 110° C., about 120° C., about 130° C., about 140° C., about 150° C., about 160° C., about 170° C., about 180° C., about 190° C., about 200° C., about 210° C., about 220° C., about 230° C., about 240° C., about 250° C., about 260° C., about 270° C., about 280° C., about 290° C., about 300° C., about 310° C., about 320° C., about 330° C., about 340° C., about 350° C., about 360° C., about 370° C., about 380° C., about 390° C., or about 400° C. In certain embodiments, the invention relates to any one of the aforementioned single-unit CVD reactors, wherein the crucible is resistively heated. In certain embodiments, the invention relates to any one of the aforementioned single-unit CVD reactors, wherein the crucible is porous. In certain embodiments, the invention relates to any one of the aforementioned single-unit CVD reactors, wherein the crucible has a nominal pore diameter of about 7 µm. In certain embodiments, the pore diameter of the crucible is from about 1 µm to about 20 µm. In certain embodiments, the pore diameter of the crucible is about 1 µm, about 2 µm, about 3 µm, about 4 µm, about 5 µm, about 6 µm, about 7 µm, about 8 µm, about 9 µm, about 10 µm, about 11 µm, about 12 µm, about 13 µm, about 14 µm, about 15 µm, about 16 µm, about 17 µm, about 18 µm, about 19 µm, or about 20 µm.

In certain embodiments, the invention relates to any one of the aforementioned single-unit CVD reactors, wherein the crucible comprises a non-volatile oxidant.

In certain embodiments, the invention relates to any one of the aforementioned single-unit CVD reactors, wherein the crucible is oriented below the other components in the chamber.

In certain embodiments, the invention relates to any one of the aforementioned single-unit CVD reactors, wherein the electrode is a microwave frequency electrode.

In certain embodiments, the invention relates to any one of the aforementioned single-unit CVD reactors, wherein the electrode is a DC electrode.

In certain embodiments, the invention relates to any one of the aforementioned single-unit CVD reactors, wherein the electrode is a radiofrequency electrode. In certain embodiments, the invention relates to any one of the aforementioned single-unit CVD reactors, wherein the radiofrequency electrode comprises a metal. In certain embodiments, the invention relates to any one of the aforementioned single-unit CVD reactors, wherein the radiofrequency electrode is a metal ring. In certain embodiments, the invention relates to any one of the aforementioned single-unit CVD reactors, wherein the radiofrequency electrode is a metal ring; and the inside circumference of the substantially cylindrical chamber is greater than the circumference of the metal ring. In certain embodiments, the invention relates to any one of the aforementioned single-unit CVD reactors, wherein the metal ring is substantially round. In certain embodiments, the invention relates to any one of the aforementioned single-unit CVD reactors, wherein the axis of the metal ring is substantially the same as the axis of the substantially cylindrical chamber. In certain embodiments, the invention relates to any one of the aforementioned single-unit CVD reactors, wherein the radiofrequency electrode is copper. In certain embodiments, the invention relates to any one of the aforementioned single-unit CVD reactors, wherein the radiofrequency electrode is insulated from the chamber. In certain embodiments, the invention relates to any one of the aforementioned single-unit CVD reactors, wherein the radiofrequency electrode is operably connected to a power source.

In certain embodiments, the invention relates to any one of the aforementioned single-unit CVD reactors, wherein the shape of the electrode is dependent upon the shape of the chamber.

In certain embodiments, the invention relates to any one of the aforementioned single-unit CVD reactors, wherein the chamber comprises a plurality of filaments. In certain embodiments, the invention relates to any one of the aforementioned single-unit CVD reactors, wherein the chamber comprises a plurality of filaments; and the filaments are spaced about 15 mm apart. In certain embodiments, the invention relates to any one of the aforementioned single-unit CVD reactors, wherein the filaments are spaced from about 1 mm apart to about 30 mm apart. In certain embodiments, the invention relates to any one of the aforementioned single-unit CVD reactors, wherein the filaments are spaced about 1 mm, about 2 mm, about 3 mm, about 4 mm, about 5 mm, about 6 mm, about 7 mm, about 8 mm, about 9 mm, about 10 mm, about 11 mm, about 12 mm, about 13 mm, about 14 mm, about 15 mm, about 16 mm, about 17 mm, about 18 mm, about 19 mm, about 20 mm, about 21 mm, about 22 mm, about 23 mm, about 24 mm, about 25 mm, about 26 mm, about 27 mm, about 28 mm, about 29 mm, or about 30 mm apart.

In certain embodiments, the invention relates to any one of the aforementioned single-unit CVD reactors, wherein the filament is in close proximity to the substrate stage. In certain embodiments, the invention relates to any one of the aforementioned single-unit CVD reactors, the filament is from about 0.1 cm to about 20 cm from the substrate stage. In certain embodiments, the invention relates to any one of the aforementioned single-unit CVD reactors, wherein the filament is about 0.1 cm, about 0.2 cm, about 0.3 cm, about 0.4 cm, about 0.5 cm, about 0.6 cm, about 0.7 cm, about 0.8 cm, about 0.9 cm, about 1.0 cm, about 1.1 cm, about 1.2 cm, about 1.3 cm, about 1.4 cm, about 1.5 cm, about 1.6 cm, about 1.7 cm, about 1.8 cm, about 1.9 cm, about 2.0 cm, about 2.1 cm, about 2.2 cm, about 2.3 cm, about 2.4 cm, about 2.5 cm, about 3.0 cm, about 3.5 cm, about 4.0 cm, about 4.5 cm, about 5.0 cm, about 5.5 cm, about 6.0 cm, about 6.5 cm, about 7.0 cm, about 7.5 cm, about 8.0 cm, about 8.5 cm, about 9.0 cm, about 9.5 cm, about 10 cm, about 11 cm, about 12 cm, about 13 cm, about 14 cm, about 15 cm, about 16 cm, about 17 cm, about 18 cm, about 19 cm, or about 20 cm from the substrate stage.

In certain embodiments, the invention relates to any one of the aforementioned single-unit CVD reactors, wherein the filament comprises a metal. In certain embodiments, the invention relates to any one of the aforementioned single-unit CVD reactors, wherein the filament is a metal.

In certain embodiments, the invention relates to any one of the aforementioned single-unit CVD reactors, wherein the filament comprises nickel. In certain embodiments, the invention relates to any one of the aforementioned single-unit CVD reactors, wherein the filament comprises chromium. In certain embodiments, the invention relates to any one of the aforementioned single-unit CVD reactors, wherein the filament comprises nickel and chromium. In certain embodiments, the invention relates to any one of the aforementioned single-unit CVD reactors, wherein the filament comprises about 80% nickel and about 20% chromium. In certain embodiments, the invention relates to any one of the aforementioned single-unit CVD reactors, wherein the filament consists essentially of nickel and chromium. In certain embodiments, the invention relates to any one of the aforementioned single-unit CVD reactors, wherein the filament consists essentially of about 80% nickel and about 20% chromium.

In certain embodiments, the invention relates to any one of the aforementioned single-unit CVD reactors, wherein the filament comprises tungsten.

In certain embodiments, the invention relates to any one of the aforementioned single-unit CVD reactors, wherein the filament is about 0.04 cm in diameter. In certain embodiments, the invention relates to any one of the aforementioned single-unit CVD reactors, wherein the filament is about 0.038 cm in diameter. In certain embodiments, the invention relates to any one of the aforementioned single-unit CVD reactors, wherein the filament is from about 0.01 cm to about 0.1 cm in diameter. In certain embodiments, the invention relates to any one of the aforementioned single-unit CVD reactors, wherein the filament is about 0.01 cm, about 0.02 cm, about 0.03 cm, about 0.04 cm, about 0.05 cm, about 0.06 cm, about 0.07 cm, about 0.08 cm, about 0.09 cm, or about 0.1 cm in diameter.

In certain embodiments, the invention relates to any one of the aforementioned single-unit CVD reactors, wherein the single-unit CVD reactor further comprises a frame, wherein the frame holds the filament in place. In certain embodiments, the invention relates to any one of the aforementioned single-unit CVD reactors, wherein the frame comprises a spring. In certain embodiments, the spring compensates for thermal expansion of the filament upon heating. In certain embodiments, the frame is larger in dimension than the substrate stage.

In certain embodiments, the invention relates to any one of the aforementioned single-unit CVD reactors, wherein the filament is operably connected to a power source.

In certain embodiments, the invention relates to any one of the aforementioned single-unit CVD reactors, wherein the chamber comprises a plurality of inlets. In certain embodiments, the invention relates to any one of the aforementioned single-unit CVD reactors, wherein at least one of the inlets is operably connected to a gas distribution manifold. In certain embodiments, the invention relates to any one of the aforementioned single-unit CVD reactors, wherein at least one of the inlets is operably connected to a gas distribution manifold equipped with a mass flow controller. In certain embodiments, the invention relates to any one of the aforementioned single-unit CVD reactors, wherein the gas distribution manifold dispenses a process gas into the single-unit CVD reactor. In certain embodiments, the invention relates to any one of the aforementioned single-unit CVD reactors, wherein the gas distribution manifold is heated.

In certain embodiments, the invention relates to any one of the aforementioned single-unit CVD reactors, wherein the process gas is a monomer, a base, an initiator, a plasma precursor, or an oxidant.

In certain embodiments, the invention relates to any one of the aforementioned single-unit CVD reactors, wherein the chamber comprises one inlet, two inlets, three inlets, four inlets, five inlets, six inlets, or seven inlets. In certain embodiments, the invention relates to any one of the aforementioned single-unit CVD reactors, wherein the chamber comprises five inlets. In certain embodiments, the invention relates to any one of the aforementioned single-unit CVD reactors, wherein the chamber comprises five inlets; wherein each inlet is operably connected to a gas distribution manifold for a different process gas; and each process gas is a monomer, a base, an initiator, a plasma precursor, or an oxidant.

In certain embodiments, the invention relates to any one of the aforementioned single-unit CVD reactors, wherein the process gas is a volatile oxidant.

In certain embodiments, the invention relates to any one of the aforementioned single-unit CVD reactors, wherein the process gas is a plasma precursor. In certain embodiments, the invention relates to any one of the aforementioned single-unit CVD reactors, wherein the process gas is oxygen, argon, or nitrogen.

In certain embodiments, the invention relates to any one of the aforementioned single-unit CVD reactors, wherein the process gas is a gaseous monomer. In certain embodiments, the invention relates to any one of the aforementioned single-unit CVD reactors, wherein the gaseous monomer is maintained at a vapor pressure from about 50 mtorr to about 1000 mtorr. In certain embodiments, the invention relates to any one of the aforementioned single-unit CVD reactors, wherein the gaseous monomer is maintained at a vapor pressure from about 50 mtorr to about 500 mtorr until a polymer coating of a desired thickness is obtained. In certain embodiments, the invention relates to any one of the aforementioned single-unit CVD reactors, wherein the gaseous monomer is maintained at a vapor pressure of about 100 mtorr, about 125 mtorr, about 150 mtorr, about 175 mtorr, about 200 mtorr, about 225 mtorr, about 250 mtorr, about 275 mtorr, or about 300 mtorr.

In certain embodiments, the invention relates to any one of the aforementioned single-unit CVD reactors, wherein the vacuum source controls the pressure in the chamber. In certain embodiments, the pressure is from about 5 mtorr to about 760 torr. In certain embodiments, the pressure is from about 5 mtorr to about 500 mtorr. In certain embodiments, the pressure is about 5 mtorr, about 10 mtorr, about 15 mtorr, about 30 mtorr, about 50 mtorr, about 75 mtorr, about 100 mtorr, about 125 mtorr, about 150 mtorr, about 175 mtorr, about 200 mtorr, about 225 mtorr, about 250 mtorr, about 275 mtorr, about 300 mtorr, about 325 mtorr, about 350 mtorr, about 375 mtorr, about 400 mtorr, about 425 mtorr, about 450 mtorr, about 475 mtorr, or about 500 mtorr.

In certain embodiments, the invention relates to any one of the aforementioned single-unit CVD reactors, wherein the orientation within the chamber of the crucible, the electrode, the filament, and the substrate stage can be varied. In certain embodiments, the invention relates to any one of the aforementioned single-unit CVD reactors, wherein the placement within the chamber of the crucible, the electrode, the filament, and the substrate stage can be varied.

In certain embodiments, the invention relates to any one of the aforementioned single-unit CVD reactors, wherein the orientation or placement of the inlets can be varied.

In certain embodiments, the invention relates to any one of the aforementioned single-unit CVD reactors, wherein any two of the crucible, the electrode, and the filament are used sequentially, in any order. In certain embodiments, the invention relates to any one of the aforementioned single-unit CVD reactors, wherein each of the crucible, the electrode, and the filament are used sequentially, in any order. In certain embodiments, the invention relates to any one of the aforementioned single-unit CVD reactors, wherein any two of the crucible, the electrode, and the filament are used simultaneously. In certain embodiments, the invention relates to any one of the aforementioned single-unit CVD reactors, wherein the crucible, the electrode, and the filaments are used simultaneously.

In certain embodiments, the invention relates to any one of the aforementioned single-unit CVD reactors, further comprising a system controller. In certain embodiments, the invention relates to any one of the aforementioned single-unit CVD reactors, wherein the system controller comprises a hard disk drive, and a processor; and the processor comprises a single-board computer, analog and digital input/output boards, interface boards, and/or stepper motor controller boards.

In certain embodiments, the invention relates to any one of the aforementioned single-unit CVD reactors, wherein the system controller controls all of the activities of the single-unit CVD reactor. In certain embodiments, the invention relates to any one of the aforementioned single-unit CVD reactors, wherein the system controller executes system control software. In certain embodiments, the invention relates to any one of the aforementioned single-unit CVD reactors, wherein the system control software is a computer program stored in a computer-readable medium such as a memory. In certain embodiments, the invention relates to any one of the aforementioned single-unit CVD reactors, wherein the computer program may include sets of instructions that dictate the timing, mixture of gases, chamber pressure, chamber temperature, RF power levels, and other parameters of a particular process.

Exemplary Methods of the Invention

In certain embodiments, the invention relates to a method of forming a polymer coating on a surface of a substrate comprising the steps of:
  (a) contacting the substrate with the substrate stage of any one of the aforementioned single-unit CVD reactors;
  (b) reducing the pressure in the chamber;
  (c) introducing a monomer gas into the chamber by way of an inlet; and
  (d) any one or more of
    (i) introducing an oxidant into the chamber;
    (ii) introducing an initiator into the chamber by way of an inlet; and applying power to the filament; or
    (iii) introducing a plasma precursor; and applying power to the electrode.

In certain embodiments, the invention relates to any one of the aforementioned methods, wherein step (d) comprises at least (i) introducing an oxidant into the chamber; and the method further comprises the step of introducing a base into the chamber. In certain embodiments, the invention relates to any one of the aforementioned methods, wherein step (d) comprises at least (i) introducing an oxidant into the chamber; and the method further comprises the step of introducing a base into the chamber by way of an inlet.

In certain embodiments, the invention relates to any one of the aforementioned methods, wherein step (d) comprises at least (i) introducing an oxidant into the chamber; and crucible comprises the oxidant. In certain embodiments, the invention relates to any one of the aforementioned methods, further comprising the step of heating the crucible. In certain embodiments, the invention relates to any one of the aforementioned methods, wherein the crucible is heated at a temperature of from about 200° C. to about 400° C. In certain embodiments, the invention relates to any one of the aforementioned methods, wherein the crucible is heated at a temperature of about 300° C.

In certain embodiments, the invention relates to any one of the aforementioned methods, wherein step (d) comprises at least (i) introducing an oxidant into the chamber; and the oxidant is a gaseous oxidant. In certain embodiments, the invention relates to any one of the aforementioned methods, wherein step (d) comprises at least (i) introducing the gaseous oxidant into the chamber by way of an inlet.

In certain embodiments, the invention relates to any one of the aforementioned methods, wherein step (d) consists essentially of (i). In certain embodiments, the invention relates to any one of the aforementioned methods, wherein step (d) consists essentially of (ii). In certain embodiments, the invention relates to any one of the aforementioned methods, wherein step (d) consists essentially of (iii). In certain embodiments, the invention relates to any one of the aforementioned methods, wherein step (d) consists essentially of (i) and (ii), sequentially, in any order. In certain embodiments, the invention relates to any one of the aforementioned methods, wherein step (d) consists essentially of (i) and (iii), sequentially, in any order. In certain embodiments, the invention relates to any one of the aforementioned methods, wherein step (d) consists essentially of (ii) and (iii), sequentially, in any order. In certain embodiments, the invention relates to any one of the aforementioned methods, wherein step (d) comprises (i), (ii), and (iii), sequentially, in any order. In certain embodiments, the invention relates to any one of the aforementioned methods, wherein step (d) consists essentially of (i) and (ii), substantially simultaneously. In certain embodiments, the invention relates to any one of the aforementioned methods, wherein step (d) consists essentially of (i) and (iii), substantially simultaneously. In certain embodiments, the invention relates to any one of the aforementioned methods, wherein step (d) consists essentially of (ii) and (iii), substantially simultaneously. In certain embodiments, the invention relates to any one of the aforementioned methods, wherein step (d) comprises (i), (ii), and (iii), substantially simultaneously.

In certain embodiments, the invention relates to any one of the aforementioned methods, wherein the monomer, the gaseous oxidant, the base, the plasma precursor, or the initiator are introduced into the chamber by way of a first inlet, a second inlet, a third inlet, a fourth inlet, or a fifth inlet. In certain embodiments, the invention relates to any one of the aforementioned methods, wherein the monomer, the gaseous oxidant, the base, the plasma precursor, and the initiator are introduced into the chamber by way of a first inlet. In certain embodiments, the invention relates to any one of the aforementioned methods, wherein the monomer, the gaseous oxidant, the base, the plasma precursor, and the initiator are introduced into the chamber by way of a first inlet, a second inlet, a third inlet, a fourth inlet, and a fifth inlet, respectively.

In certain embodiments, the invention relates to any one of the aforementioned methods, further comprising the step of heating the substrate stage at a temperature of from about 25° C. to about 100° C. In certain embodiments, the invention relates to any one of the aforementioned methods, further comprising the step of heating the substrate stage at a temperature of about 30° C., about 40° C., about 50° C., about 60° C., about 70° C., about 80° C., or about 90° C.

In certain embodiments, the invention relates to any one of the aforementioned methods, further comprising the step of closing the window, door, or lid.

In certain embodiments, the invention relates to any one of the aforementioned methods, the pressure in the chamber is from about 5 mtorr to about 760 torr.

In certain embodiments, the invention relates to any one of the aforementioned methods, wherein said coating is of a substantially uniform thickness.

In certain embodiments, the invention relates to any one of the aforementioned methods, wherein said thickness does not vary more than 10% over the surface.

In certain embodiments, the invention relates to any one of the aforementioned methods, wherein said thickness does not vary more than 5% over the surface.

In certain embodiments, the invention relates to any one of the aforementioned methods, wherein said thickness does not vary more than 1% over the surface.

Applications and Articles of the Invention

Articles formed in any one of the aforementioned reactors have may be used as electronics, optoelectronics, photovoltaic devices, or packaging. The articles may be coated with a variety of organic and inorganic materials on substrates that are rough, fibrous, or porous, with high surface areas. Increasing the effective surface area of an article will improve operating efficiencies of the article.

In certain embodiments, the invention relates to an article comprising a composition, wherein the composition comprises a coating on a surface of a substrate; and any one of the aforementioned reactors was used to fabricate the article.

INCORPORATION BY REFERENCE

All of the U.S. patents and U.S. patent application publications cited herein are hereby incorporated by reference.

EQUIVALENTS

Those skilled in the art will recognize, or be able to ascertain using no more than routine experimentation, many equivalents to the specific embodiments of the invention described herein. Such equivalents are intended to be encompassed by the following claims.

We claim:

1. A single-unit CVD reactor, comprising a chamber, wherein:
   the chamber comprises a substrate stage, a radiofrequency electrode, a filament, a monomer inlet, an oxidant crucible, and optionally a oxidant inlet;
   the oxidant crucible is operably connected to a heat source;
   the substrate stage is oriented above the filament;
   the substrate stage is operably connected to a heat source or a cooling source;
   the chamber is operably connected to a vacuum source;
   the monomer inlet is operably connected to a source of a monomer gas; and
   the oxidant inlet, if present, is operably connected to a source of oxidant gas.

2. The single-unit CVD reactor of claim 1, wherein the single-unit CVD reactor further comprises a window, a door, or a lid on the chamber.

3. The single-unit CVD reactor of claim 1, wherein the chamber is substantially cylindrical in shape.

4. The single-unit CVD reactor of claim 1, wherein the chamber comprises glass or stainless steel.

5. The single-unit CVD reactor of claim 1, wherein the substrate stage is operably connected to a DC power supply.

6. The single-unit CVD reactor of claim 1, wherein the radiofrequency electrode comprises a metal.

7. The single-unit CVD reactor of claim 1, wherein the chamber comprises a plurality of filaments.

8. The single-unit CVD reactor of claim 7, wherein the filaments are spaced from about 1 mm apart to about 30 mm apart.

9. The single-unit CVD reactor of claim 1, wherein the filament is from about 0.1 cm to about 20 cm from the substrate stage.

10. The single-unit CVD reactor of claim 1, wherein the filament comprises a metal.

11. The single-unit CVD reactor of claim 1, wherein the filament is from about 0.01 cm to about 0.1 cm in diameter.

12. The single-unit CVD reactor of claim 1, wherein a pressure inside the chamber is from about 5 mtorr to about 760 torr.

13. A single-unit CVD reactor, comprising a chamber, wherein:
   the chamber comprises a substrate stage, an oxidant crucible, a radiofrequency electrode, a filament, and an inlet, wherein
   the substrate stage is oriented above the filament;
   the substrate stage is operably connected to a heat source or a cooling source;
   the chamber is operably connected to a vacuum source; and
   the inlet is operably connected to a source of a monomer gas.

14. The single-unit CVD reactor of claim 13, wherein the single-unit CVD reactor further comprises a window, a door, or a lid on the chamber.

15. The single-unit CVD reactor of claim 13, wherein the chamber comprises glass or stainless steel.

16. The single-unit CVD reactor of claim 13, wherein the substrate stage is operably connected to a DC power supply.

17. The single-unit CVD reactor of claim 13, wherein the radiofrequency electrode comprises a metal.

18. The single-unit CVD reactor of claim 13, wherein the chamber comprises a plurality of filaments.

19. The single-unit CVD reactor of claim 18, wherein the filaments are spaced from about 1 mm apart to about 30 mm apart.

20. The single-unit CVD reactor of claim 13, wherein the filament comprises a metal.

* * * * *